(12) United States Patent
Min et al.

(10) Patent No.: US 7,795,607 B2
(45) Date of Patent: Sep. 14, 2010

(54) CURRENT FOCUSING MEMORY ARCHITECTURE FOR USE IN ELECTRICAL PROBE-BASED MEMORY STORAGE

(75) Inventors: Kyu S. Min, San Jose, CA (US); Nathan R Franklin, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 306 days.

(21) Appl. No.: 11/529,830

(22) Filed: Sep. 29, 2006

(65) Prior Publication Data

US 2008/0078982 A1 Apr. 3, 2008

(51) Int. Cl.
*H01L 29/76* (2006.01)
*H01L 47/00* (2006.01)

(52) U.S. Cl. .................. 257/4; 257/2; 257/3; 257/5; 257/E27.004; 257/E31.008; 257/E31.029; 257/E45.002; 438/95; 438/96; 369/126

(58) Field of Classification Search .............. 257/2, 257/3, 4, 5, E27.004, E31.008, E31.029, 257/E45.002; 369/126; 438/95, 96
See application file for complete search history.

(56) References Cited

U.S. PATENT DOCUMENTS

| | | | |
|---|---|---|---|
| 6,746,892 B2 * | 6/2004 | Lee et al. ............... | 438/95 |
| 6,870,751 B2 * | 3/2005 | Van Brocklin et al. ... | 365/96 |
| 7,223,693 B2 * | 5/2007 | Choi et al. .............. | 438/672 |
| 7,381,982 B2 * | 6/2008 | Hsueh ..................... | 257/4 |
| 7,463,573 B2 * | 12/2008 | Fan et al. ................ | 369/126 |
| 2004/0087074 A1 * | 5/2004 | Hwang et al. .......... | 438/198 |
| 2005/0121659 A1 * | 6/2005 | Tanaka et al. ........... | 257/4 |

OTHER PUBLICATIONS

Kyu S. Min, etal., U.S. Appl. No. 11/392,102, "Probe-Based Memory", filed Mar. 28, 2006.
Qing Ma, etal., U.S. Appl. No. 11/447,276, "Bit-Erasing Architecture for Seek-Scan Probe (SSP) Memory Storage", filed Jun. 28, 2006.
Chen X, Wu NJ, Strozier J, etal., "Direct resistance profile for an electrical pulse induced resistance change device", Applied Physics Letters 87 (23): Art. No. 233506, Dec. 5, 2005.
Watanabe Y, Bednorz JG, Bietsch A, etal., "Current-driven insulator-conductor transition and nonvolativle memory in chromium-doped SrTiO3 single crystals", Applied Physics Letters 78 (23): 3738-3740 Jun. 4, 2001.
K.W. Guamini, etal., Low voltage, scalable nanocrystal FLASH memory fabricated by templated self assembly, IEDM Tech Dig., 7803-7873, Mar. 2003.
D.R. McKenzie, etal., "Application of tetrahedral amorphous carbon in limited volatitlity memory and in field programmable gate arrays", Diamond and Related Materials 10, 230-233 (2001).

(Continued)

*Primary Examiner*—Dao H Nguyen
(74) *Attorney, Agent, or Firm*—Blakely, Sokoloff, Taylor & Zafman LLP (57) ABSTRACT

An apparatus comprising a substrate, an electrode coupled to the substrate, a modifiable layer coupled to the electrode, and a current focusing layer coupled to the modifiable layer. The current focusing layer comprises a conductive region and an insulating region. A method comprising forming a modifiable layer on an electrode and forming a current focusing layer on the modifiable layer.

33 Claims, 9 Drawing Sheets

OTHER PUBLICATIONS

S. Gidon, etal., "Electrical probe storage using Joule heating in phase change media", Applied Physics Letters 85, 6392-6394, 2004.

H. Chik, etal., "Nanometric superlattices: non-lithographic fabrication, materials, and prospects", Materials Science and Engineering R 43 103-138, 2004.

Victor F. Puntes, etal., "Synthesis of hcp-Co Nanodisks", J. Am. Chem. Soc. 12874-12880, 2002.

J. Robertson, "Diamond-like amorphous carbon", Materials Science and Engineering R 37, 129-281, 2002.

* cited by examiner

CURRENT FOCUSING MEMORY ARCHITECTURE FOR USE IN ELECTRICAL PROBE-BASED MEMORY STORAGE

BACKGROUND

1. Field

Micro-electro-mechanical (MEMS) devices and systems and in particular, but not exclusively, MEMS probe based memory storage.

2. Background

Solid state memories typically employ micro-electronic circuit elements for each memory bit. Since one or more electronic circuit elements are required for each memory bit (e.g., one to four transistors per bit), these devices can consume considerable chip "real estate" to store a bit of information, which limits the density of a memory chip. The primary memory element in these devices is typically a floating gate field effect transistor device that holds a charge on the gate of field effect transistor to store each memory bit. Typical memory applications include dynamic random access memory (DRAM), static random access memory (SRAM), erasable programmable read only memory (EPROM), and electrically erasable programmable read only memory (EEPROM).

Phase-change memory uses a phase-change material as the data storage mechanism and offers significant advantages in both cost and performance over conventional memories based on charge storage. Phase-change memories use phase-change materials that can be electrically switched between two or more phases having different electrical characteristics such as resistance. One type of memory element, for example, uses a phase-change material that can be electrically switched between a generally amorphous phase and a generally crystalline local order, or between different detectable phases of local order across the entire spectrum between completely amorphous and completely crystalline phases.

The phase-change memory can be written to, and read from, by applying current pulses that have the appropriate magnitude and duration and that cause the needed voltages across and current through the volume of phase-change material. A selected cell in a phase-change memory can be programmed into a selected state by raising a cell voltage and a cell current for the selected cell to programming threshold levels that are characteristic of the phase-change material. The voltage and current are then typically lowered to quiescent levels (e.g. essentially zero voltage and current) that are below the programming threshold levels of the phase-change material. This process can be performed by the application of, for example, a reset pulse and a set pulse which can program the cell into two different logic states. In both of these pulses, the cell voltage and cell current are caused to rise at least as high as certain threshold voltage and current levels needed to program the cell. Next, to read the programmed cell, a read pulse can be applied to measure the relative resistance of the cell material, without changing its phase. Thus, the read pulse typically provides a much smaller magnitude of cell current and cell voltage than either the reset pulse or the set pulse.

Electrical memory devices employing phase-change material typically do not use field effect transistor devices, but comprise, in the electrical context, a monolithic body of thin film chalcogenide material. As a result, very little chip real estate is required to store a bit of information, thereby providing for inherently high density memory chips. The phase-change materials are also truly non-volatile in that, when set in either a crystalline, semi-crystalline, amorphous, or semi-amorphous phase representing a resistance value, that value is retained until reset as that value represents a physical phase of the material (e.g., crystalline or amorphous).

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

Embodiments of an apparatus, system and method for a current focusing probe based memory are described herein. In the following description, reference to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
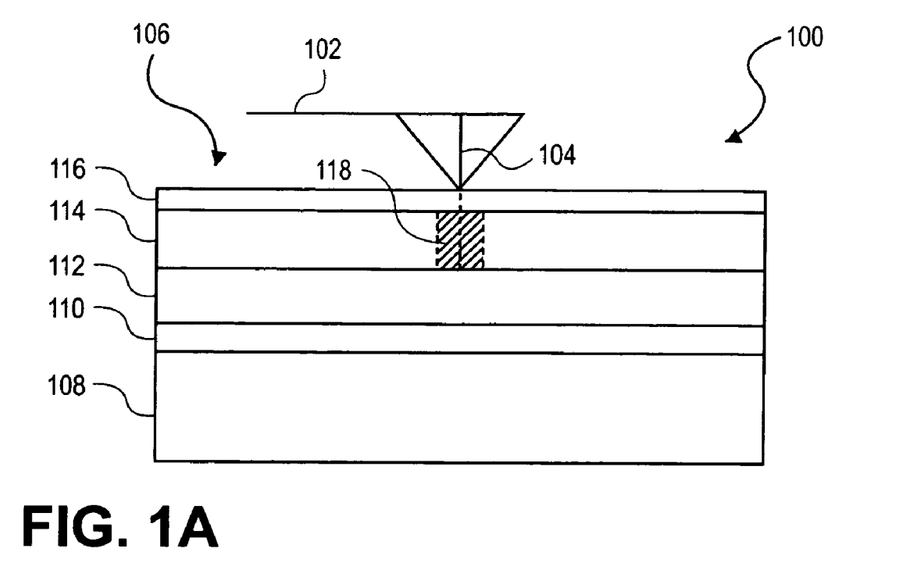
FIG. 1A is a cross-sectional side view of a probe based memory.
Figure 1B:
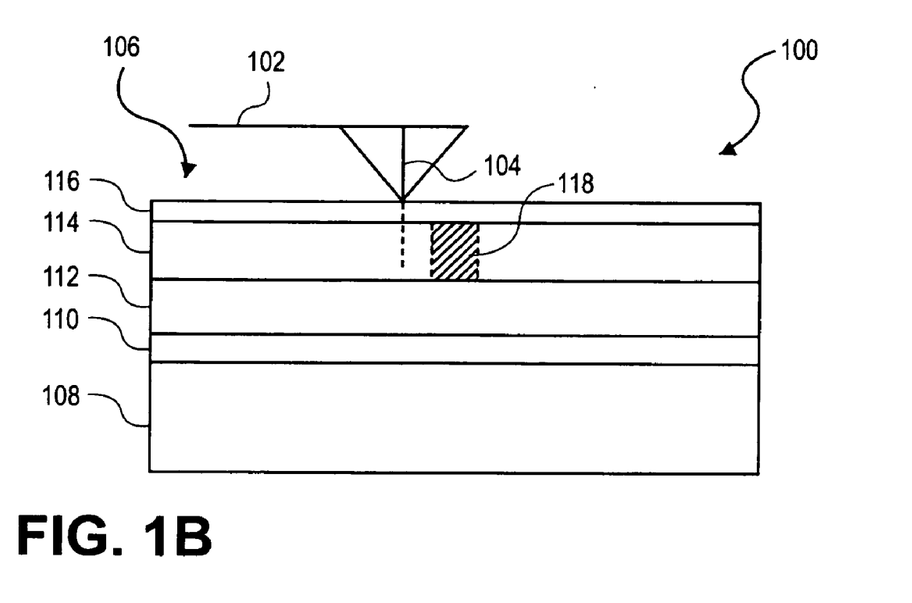
FIG. 1B is the device of FIG. 1A where the probe is misaligned.

FIGS. 1A and 1B illustrate cross-sectional side views of a probe based memory 100, for example a phase-change memory, that uses probe 102 to write data in and read data from memory cell 106. Probe 102 is, for example, a translatable device connected to a substrate package. The substrate package, for example, is moved relative to the probe. Reading and writing may be performed when probe 102 senses a change in resistivity within the substrate package. Memory cell 106 includes substrate 108 having dielectric layer 110 formed thereon. An electrode 112 is formed on dielectric layer 110. A phase-change layer 114 is formed on electrode layer 112 and an optional protective layer 116 is formed on the phase-change layer 114. FIG. 1A illustrates memory 100 having a data bit written in phase-change layer 114. In this aspect, a current 104 is passed between the tip of probe 102 and electrode layer 112 thereby transforming region 118 of phase-change layer 114 from a first phase (e.g. an amorphous phase) to a second phase (e.g. a polycrystalline phase) with relatively higher or lower resistivity. Alternatively, the first phase may be a polycrystalline phase and the second phase may be an amorphous phase. Region 118 then represents a data bit that can be read using probe 102. It is contemplated that current 104 may spread while passing through protective layer 116 therefore leading to bit size enlargement. To read the data bit, probe 102 is passed over a surface of memory cell 106 and current 104 is passed between probe 102 and electrode 112 such that probe 102 can sense the change of resistivity when it is over or near region 118. Probe 102 is coupled to electronic equipment known in the art that allows it to, upon sensing the change in resistivity, register the data bit as a 1 or a 0.

FIG. 1A illustrates an embodiment where probe 102 is aligned with region 118 of phase-change layer 114. In this aspect, current 104 traveling from the tip of probe 102 to electrode 112 may be used to, for example, read region 118. FIG. 1B illustrates the device of FIG. 1A where probe 102 is misaligned. As shown in the figure, the tip of probe 102 is slightly offset from region 118 of phase-change layer 114. As a result, a maximum current density from current 104 traveling from the tip of probe 102 to electrode 112 does not pass through region 118. Consequently, a current density required to read data bit 118 may not be achieved.

Figure 2:
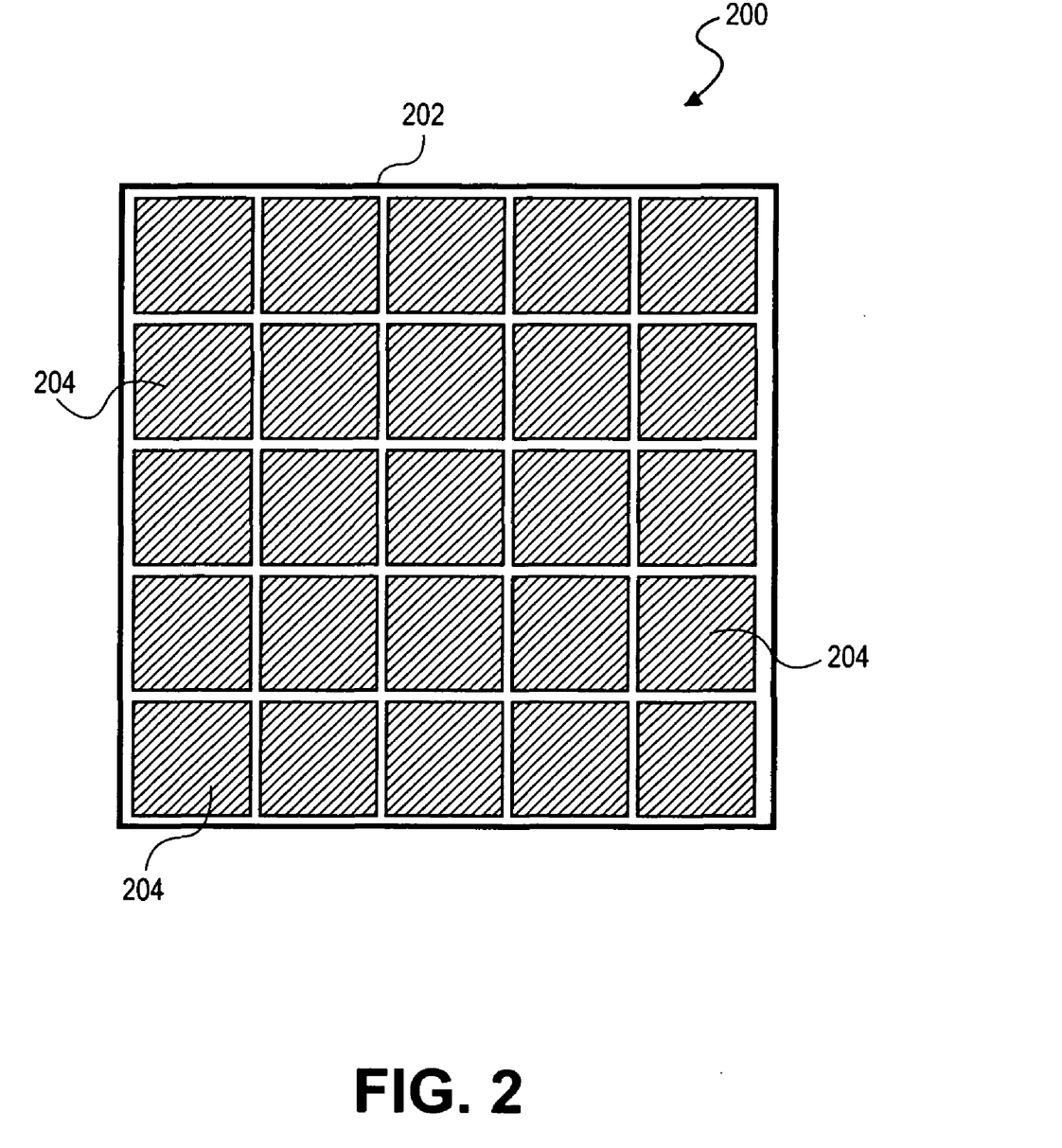
FIG. 2 is a plan view of a possible embodiment of a probe based memory.

FIG. 2 is a plan view of a possible embodiment of a probe based memory. Memory 200 includes a plurality of individual memory cells or sub-islands 204 grouped into an array 202. Each memory cell 204 in array 202 can be modified independently of the others. As shown, memory 200 includes 25 memory cells 204 grouped into a five-by-five array 202. In other embodiments, the number of memory cells 204 can be greater than or less than 25, and in other embodiments can be grouped into arrays of different shapes than the array 202 shown in the figure. Although not shown in the figure, memory 200 can also include one or more probes, such as probe 102 or some other type of probe, to write and read data to and from each memory cell. In one embodiment, memory 200 can include one probe that can read and write in all the memory cells 204, but in other embodiments more probes can be used. In some embodiments, for example, each memory cell 204 can have one or more probes of its own, while in other embodiments a single probe can cover a subset of memory cells 204 within array 202. Still other embodiments can include separate probes for writing and reading, either over the whole array 202 or in individual memory cells or groups of memory cells.

Figure 3:
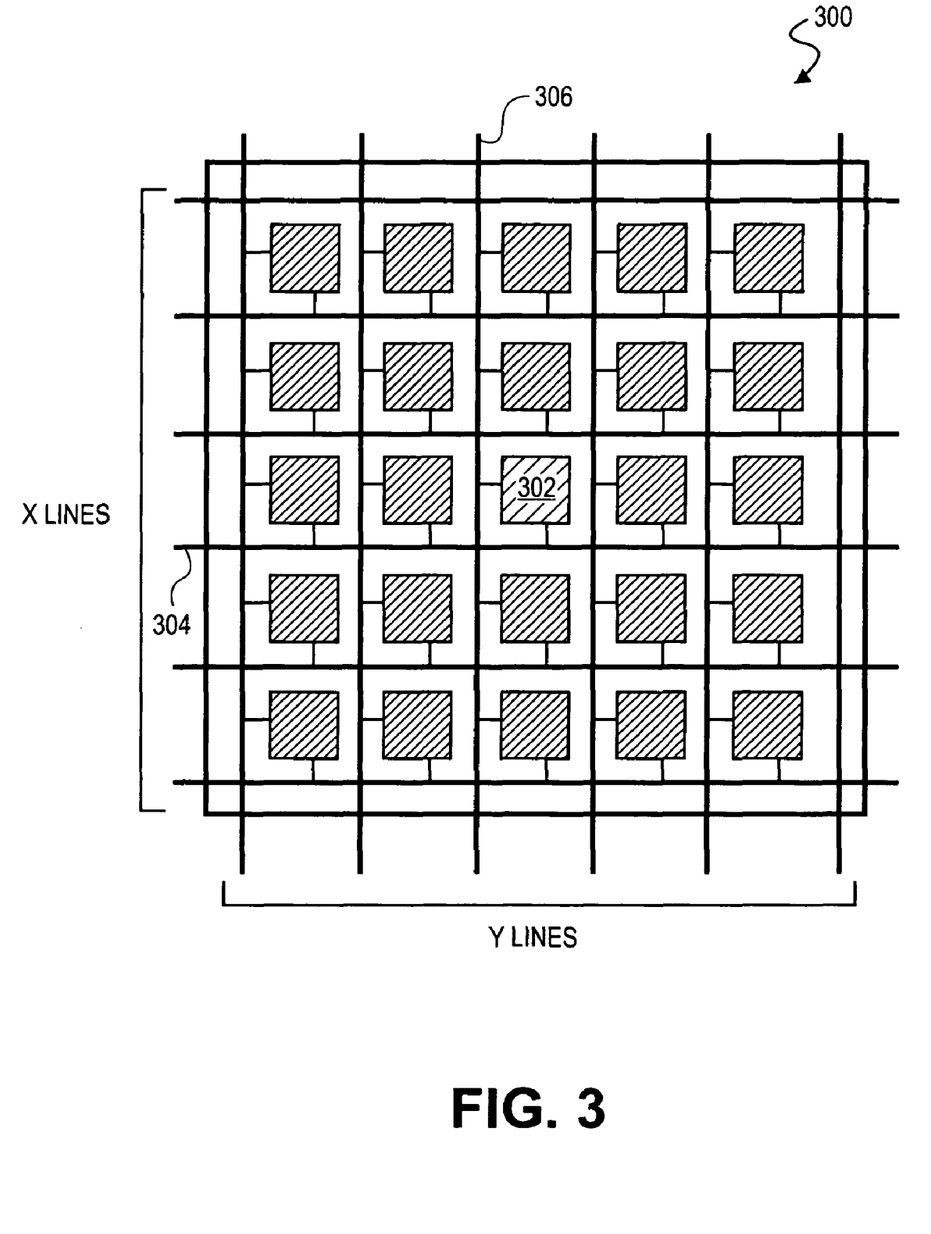
FIG. 3 is a plan view of an embodiment of an array of individually addressable memory cells comprising a memory.

FIG. 3 is a plan view of an embodiment of an array of individually addressable memory cells comprising a memory, for example a phase-change memory. As with the memory 200, memory 300 includes one or more memory cells or sub-islands grouped into an array and can include one or more probes (not shown) to write data to and read data from individual cells. Conductive lines are formed between the memory cells such that each memory cell is electrically coupled to two lines and can therefore be individually addressed. In the embodiment shown the memory cells are arranged such that each memory cell in the array is electrically coupled to both an X-line and a Y-line. For example, memory cell 302 is coupled to X-line 304 and Y-line 306. One or both of the X-lines and Y-lines are coupled to circuitry (not shown) that allows memory cell 302 to be individually addressed by activating X-line 304 and Y-line 306. In one embodiment, for example, the X-lines can be coupled to a power source and to control circuitry, while the Y-lines can be coupled to ground and also to the control circuitry.

In the embodiment shown, the memory cells are arranged in a regular X-Y array, such that the conductive lines include a plurality of X-lines as well as a plurality of Y-lines and each memory cell in the array is electrically coupled to both an X-line and a Y-line. The X-lines and Y-lines are positioned between individual memory cells, but in other embodiments a different routing of one or both of the X-lines and Y-lines is possible. Moreover, memory 300 is shown as a regular five-by-five array, but in other embodiments different numbers of cells and different arrangements within the array can be used.

Figure 4A:
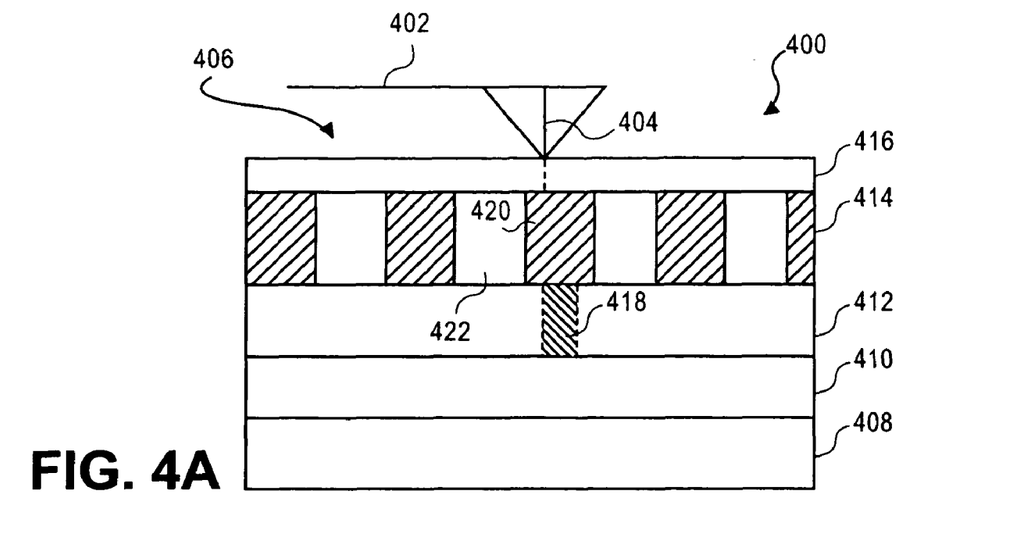
FIG. 4A is a cross-sectional side view of an embodiment of a memory cell useable, for example, in the cell arrays shown in FIG. 2 or FIG. 3.

FIG. 4A is a cross-sectional side view of an embodiment of a memory cell useable, for example, in the cell arrays shown in FIG. 2 or FIG. 3. Probe based memory system 400 includes a probe 402 and a memory cell 406. Memory cell 406 includes a substrate 408 upon which an electrode 410 is formed. A dielectric layer (not shown) may optionally be formed between substrate 408 and electrode 410 as deemed desirable.

Probe 402 is shown as a cantilever probe, but in other embodiments, probe 402 may be a different type of probe. For example, probe 402 may be supported from one or more bridge structures that straddle memory cell 406 on substrate 408.

Substrate 408 may be any kind of substrate that is compatible with the manufacturing requirements for the memory 400 and whose properties are consistent with the construction of memory 400. In one embodiment substrate 408 may be one or more of the various forms of silicon, such as polysilicon, single-crystal silicon, silicon oxide and the like. In other embodiments, substrate 408 may be made of different materials. Electrode 410 overlying substrate 408 may be made of a metal, including, but not limited to, gold (Au), copper (Cu) or aluminum (Al). In other embodiments, electrode 410 may be made of other metals, metal alloys or conductive non-metals as deemed desirable.

A modifiable layer 412 is formed on electrode 410. Modifiable layer 412 may be made of a phase-change material that changes phase and whose different phases have different electrical characteristics (such as different resistivities or, conversely, different conductivities). In one embodiment, for example, modifiable layer 412 may use chalcogenide materials. Chalcogenides are glass-like materials containing a chalcogenide element (which include, but are not limited to, sulfur, selenium or tellurium) as a substantial constituent. Examples of chalcogenides useful in a phase-change memory include Germanium-sulfur-tellurium (nominally GeSTe), Germanium-Antimony-Tellurium (nominally GeSbTe) and Silver-Indium-Antimony-Tellurium (nominally AgInSbTe).

Other examples of chalcogenide materials include Indium-Selenium (nominally InSe), Antimony-Selenium (nominally SbSe), Antimony-Tellurium (nominally SbTe), Indium-Antimony-Selenium (nominally InSbSe), Indium-Antimony-Tellurium (nominally InSbTe), Germanium-Antimony-Selenium (nominally GeSbSe), Germanium-Antimony-Tellurium-Selenium (nominally GeSbTeSe), and Silver-Indium-Antimony-Selenium-Tellurium (nominally AgInSbSeTe). Other materials besides chalcogenides may be used in other embodiments. In another embodiment, modifiable layer 412 may be made of any material whose resistance changes after application of a voltage or current without experiencing a distinct phase change (e.g. amorphous to crystalline) such as a resistance switching material. Resistance switching materials may include, but are not limited to, manganese perovskites such as $Pr_{(1-x)}Ca_xMnO_3$ (PCMO), $SrTiO_3$, $Nb_2O_5$, $TiO_2$, $Ta_2O_5$ and NiO.

Current focusing layer 414 is formed on modifiable layer 412. Current focusing layer 414 may be a thin film (e.g. 10 nanometer (nm) thickness) that includes an array of conductive regions 420 and insulating regions 422. Conductive regions 420 may represent conductive paths and the insulating regions 422 may be formed by regions of an insulating matrix surrounding the conductive paths. Conductive paths 420 may be, for example, pillars, nanoparticles, or nanocrystals of a conductive material formed within the insulating matrix. Conductive paths 420 may be very high density (>1e11/$cm^2$~tetrabit/$in^2$) electrical conduction paths that are confined in a direction parallel to a direction of electric field applied to current focusing layer 414 thru a probe tip. For example, in the embodiment shown in FIGS. 4A and 4B, conductive paths 420 are in a vertical direction. Conductive paths 420 may be built into current focusing layer 414 in a regularly spaced array using lithography free synthesis techniques. In one embodiment, conductive paths 420 may have a diameter of from about 10 nm to about 30 nm. Alternatively, conductive paths 420 may have a diameter less than 10 nm or greater than 30 nm as deemed desirable. The high electrical conductivity anisotropy of current focusing layer 414 allows for current 404 from probe 402 to be focused to the smallest possible region of current focusing layer 414 (e.g. conductive paths 420) and an underlying region 418 of modifiable layer 412 thereby minimizing current spread and resulting in a written bit aligned with each conductive path 414. Consequently, current spread, which leads to bit size enlargement or insufficient current density required to write or over-write is minimized resulting in an ultrahigh density (sub 50 nm pitch, ~tetrabit/$in^2$) memory matrix and reduced operational requirements. In particular, a diameter of a bit achieved by the lithography free techniques described herein may be about 10 nm or less. Such sizes are mechanically very difficult, if even possible, and expensive to achieve with lithography techniques. It is further contemplated that a larger bit diameter may be achieved, for example, from about 10 nm to about 30 nm as deemed desirable.

Lithography-free techniques are used to form current focusing layer 414. As will be discussed in reference to FIGS. 5-15, suitable fabrication techniques include, but are not limited to, AAO nanopore engineering, co-polymer templated assembly and nanocrystal self-assembled monolayer formation. It is further contemplated that current focusing layer 414 may be formed using "anti-fuse" materials and techniques. An "anti-fuse" material is a material which may be changed, for example, from a non-conductive state to a conductive state through the application of an electrical current. In particular, the material may be a thin, non-conducting amorphous silicon or carbon placed between two metal conductors. When a sufficiently high voltage is applied across, for example, the amorphous silicon it is turned into a polycrystalline silicon-metal alloy with a low resistance, which is conductive. Thus, instead of predefining the conductive pathways as described in FIGS. 5-15, the pathways are created upon application of a current from the probe tip.

A wear-resistant layer 416 is further shown formed on current focusing layer 414 to protect memory cell 406 from contaminants and to minimize mechanical damage to memory cell 406 which may occur when the tip of probe 402 comes into contact with memory cell 406. In some embodiments, a suitable material for wear-resistant layer 416 may be any material having hardness matching to that of the tip, a low friction coefficient with respect to the tip surface with high asymmetric electrical conductivity and/or low energy barrier electronic tunneling properties. Exemplary materials may include, but are not limited to, diamond-like carbon (DLC), doped or undoped silicon carbide or ceramic materials such as titanium nitrate (TiN) or titanium-aluminum-nitrate (TiAlN).

Wear-resistant layer 416 is optional and therefore may be omitted in some embodiments. For example, in the case where current focusing layer 414, in addition to having the current focusing properties, meets the tribological requirements of wear-resistant layer 416 as described herein, wear-resistant layer 416 may be omitted. In particular, a material which displays a filamentary conduction mechanism in the direction of electrical field and high (e.g. >2 electron volts (eV)) electronic band gap in the lateral direction may be used. Such materials may include, but are not limited to, amorphous carbon or diamond-like carbon films with varying degrees of crystallinity. Alternatively, current focusing layer 414 may, in addition to current focusing properties, have wear-resistant properties such that the wear-resistant layer may be omitted.

In the embodiment of FIG. 4A, probe 402 is shown aligned with an underlying region 418 of modifiable layer 412 to be, for example, read. Since probe 402 and therefore current 404 are aligned with region 418, a sufficient current 404 for reading region 418 passes from the tip of probe 402 through conductive path 420 to region 418.

Figure 4B:
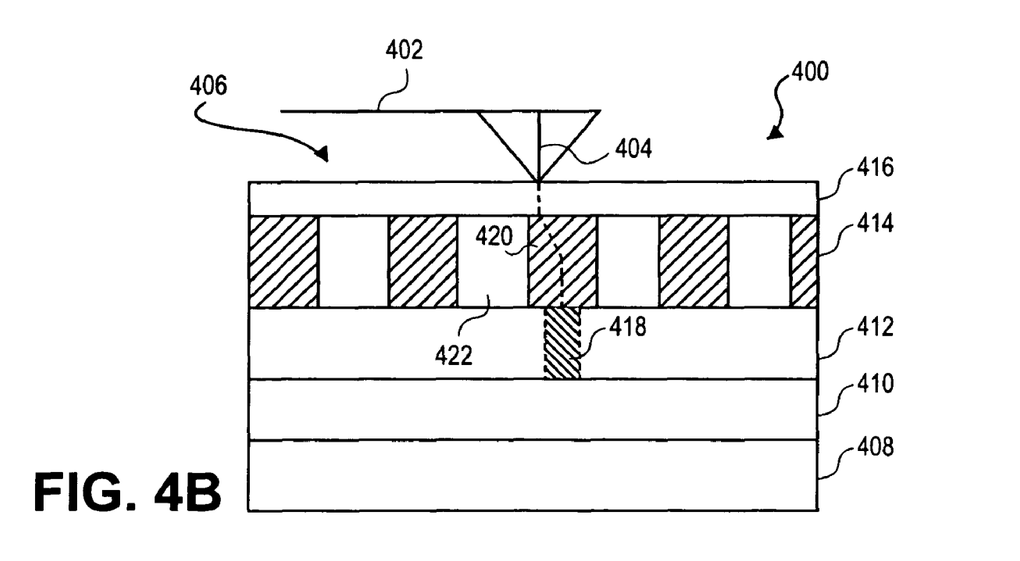
FIG. 4B is the device of FIG. 4A where the probe is misaligned.

FIG. 4B illustrates memory cell 406 with misaligned probe 402. In particular, the tip of probe 402 and thus current 404 is offset from region 418 of modifiable layer 412. As previously discussed, in the absence of a current focusing layer, such misalignment will result in an insufficient current density needed to read, write or over-write region 418. Consequently, energy requirements of the system may be increased. In the instant embodiment, although current 404 is offset from region 418, it is still aligned with conductive path 420 of current focusing layer 414 and is therefore still drawn to underlying region 418. Thus, even though probe 402 is misaligned, current focusing layer 414 ensures that a sufficient current density reaches region 418. In this aspect, current focusing layer 414 provides a tolerance to memory cell 406 against misregistry of the tip in addressing programmed bits.

Figure 5:
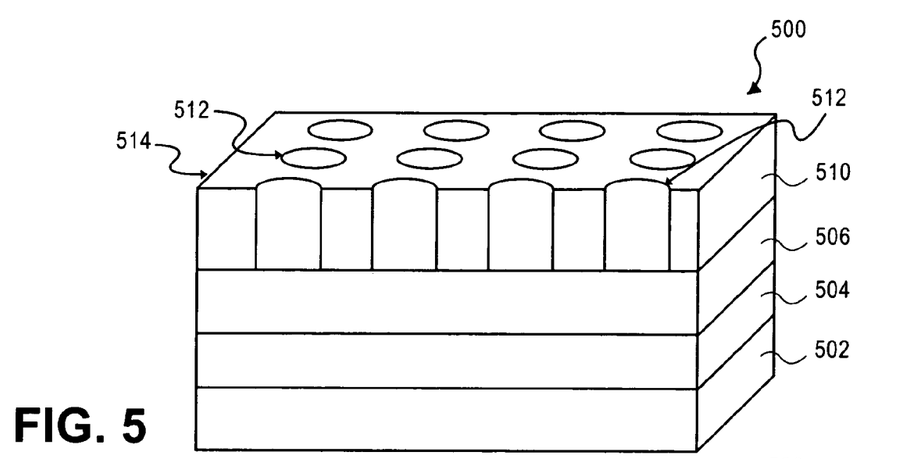
FIG. 5 is a perspective view of an embodiment of the device of FIGS. 4A and 4B wherein the current focusing layer is formed using an anodized aluminum oxide (AAO) film technique.

FIG. 5 is an embodiment of the device of FIGS. 4A and 4B wherein the current focusing layer is formed using an anodized aluminum oxide (AAO) film technique. Memory cell 500 includes a substrate 502 and an electrode 504 formed on substrate 502. As previously discussed, a dielectric layer (not shown) may further be provided between substrate 502 and electrode 504. Modifiable layer 506 is formed on electrode 504. In this embodiment, a current focusing layer 514 is formed on modifiable layer 506 by first forming an aluminum oxide (AAO) film 510 onto modifiable layer 506. AAO film 510 may be formed by any technique deemed desirable. AAO film 510 is a self-organized membrane that once deposited will define a uniform array of highly anisotropic pores 512. Pore 512 may have a diameter less than about 200 nanometers (nm), and in some embodiments less than 10 nm. Pores 512 may have a length of about 1 micrometer (μm) to about 50 μm, and in some embodiments less than 1 μm, for example, 1 nm. AAO film 510 may have a pore density from about 1E9 pores/cm^2 to about 1E13 pores/cm^2. It is further contemplated that the dimensions of pores 512 of AAO film 510 may be modified as deemed desirable.

Figure 6:
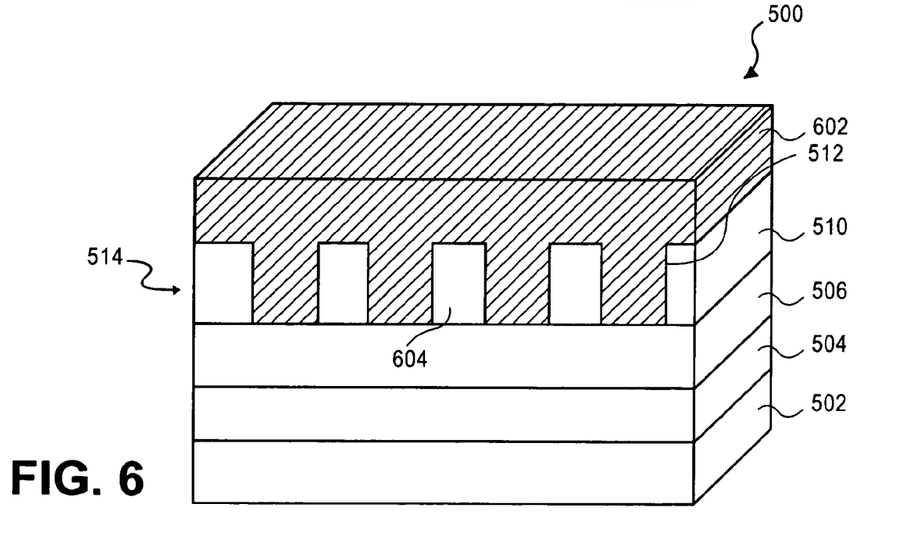
FIG. 6 is the device of FIG. 5 after the further processing operation of applying a conductive material.
Figure 7:
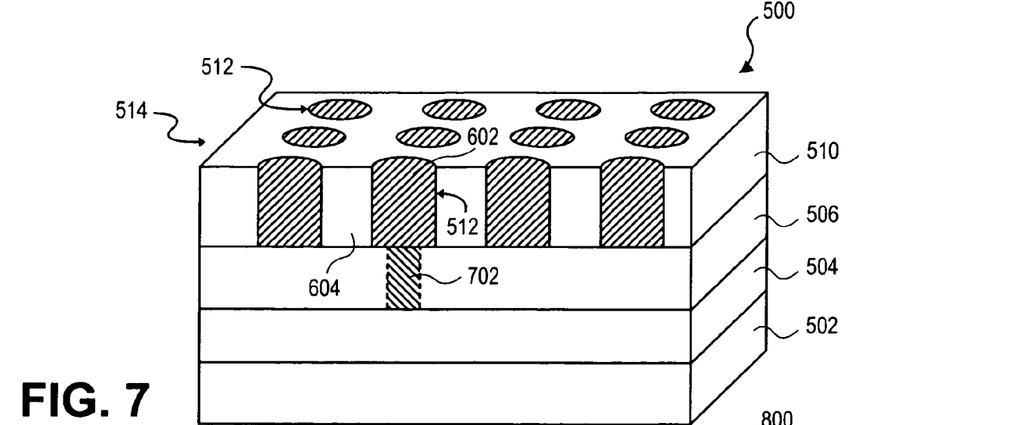
FIG. 7 is the device of FIG. 5 after the further processing operation of removing excess conductive material.

As illustrated in FIG. 6, a layer of conductive material 602 is formed over AAO film 510 by any technique deemed desirable. Conductive material 602 fills pores 512 thereby creating conductive paths between insulating regions 604 formed by AAO film 510. Suitable conductive materials may include, but are not limited to, conductive metals such as gold, silver, iron, nickel, copper and other similar materials. Alternatively, the conductive material may be a conductive non-metal, for example, a ceramic material. As illustrated in FIG. 7, after pores 512 are filled with conductive material 602, excess conductive material may be polished off by any polishing technique deemed desirable. In some embodiments, pores may be filled completely as shown in FIG. 7. Alternatively, pores 512 may be partially filled with conductive material 602 by, for example, forming an amount of conductive material over AAO film 510 sufficient to only partially fill pores 512. In this aspect, polishing may be omitted. The remaining array of pores 512 filled with conductive material 602 represent the conductive paths and regions 604 of AAO film 510 the insulating matrix which form the current focusing layer 514. Once current focusing layer 514 is formed, a region 702 of modifiable layer 506 underlying each conductive path 512 may be transformed from a first phase (e.g., an amorphous phase) to a second phase (e.g., a polycrystalline phase) with a relatively higher or lower resistivity. Region 702 may then represent a data bit that can be read using a probe. Although not shown, the optional wear-resistant layer as previously discussed may be formed over current focusing layer 514.

Figure 8:
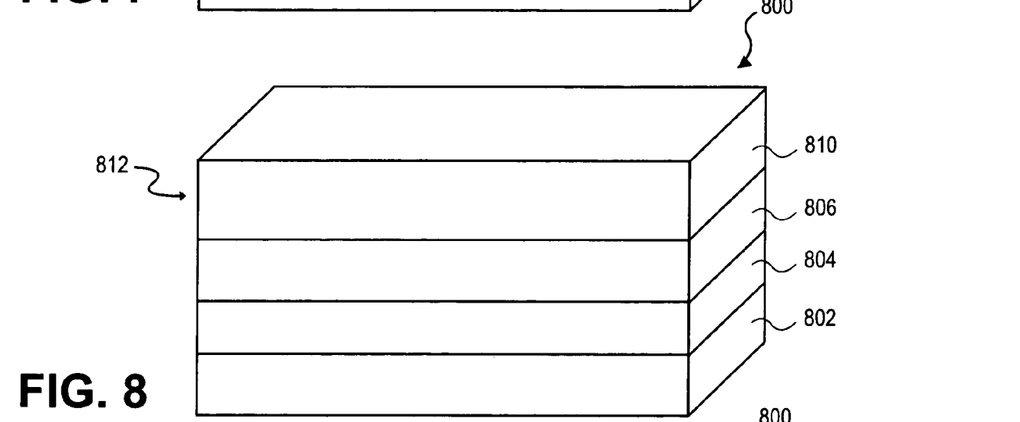
FIG. 8 is a perspective view of another embodiment of the device of FIGS. 4A and 4B wherein the current focusing layer is formed using a co-polymer templated assembly.

FIG. 8 is another embodiment of the device of FIGS. 4A and 4B wherein the current focusing layer is formed using a co-polymer templated assembly. In this embodiment, memory cell 800 includes a substrate 802 with an electrode 804 formed thereon. Optionally, a dielectric layer (not shown) may be formed between substrate 802 and electrode 804. In this embodiment, current focusing layer 812 is created by forming an insulating layer 810 over modifiable layer 806 using any technique deemed desirable. Insulating layer 810 may be silicon dioxide ($SiO_2$), silicon nitride (SiN) or any other similarly suitable insulating material.

Figure 9:
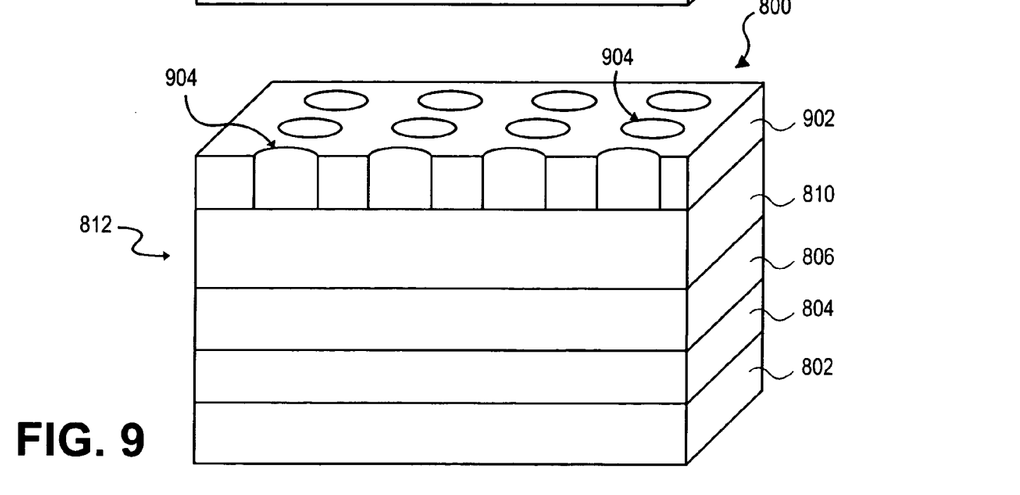
FIG. 9 is the device of FIG. 8 after the further processing operation of applying a porous polymer layer to an oxide hard mask.
Figure 10:
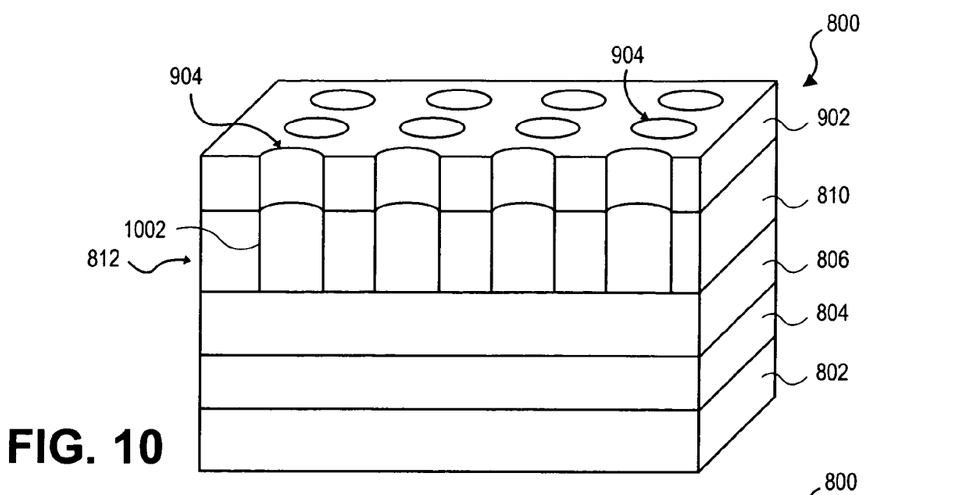
FIG. 10 is the device of FIG. 8 after the further processing operation of transferring a porous pattern from the porous polymer layer into the oxide hard mask.
Figure 11:
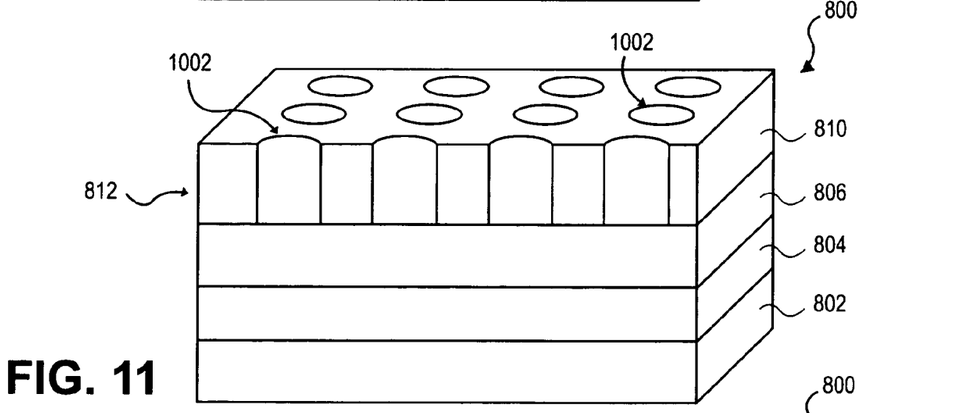
FIG. 11 is the device of FIG. 8 after the further processing operation of removing the porous polymer layer.
Figure 12:
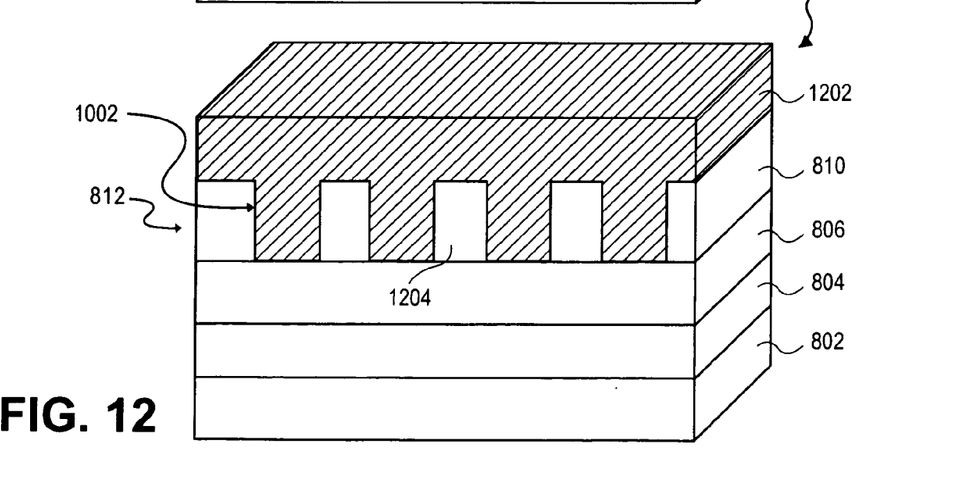
FIG. 12 is the device of FIG. 8 after the further processing operation of applying a silicon nanocrystal layer on the oxide hard mask layer.
Figure 13:
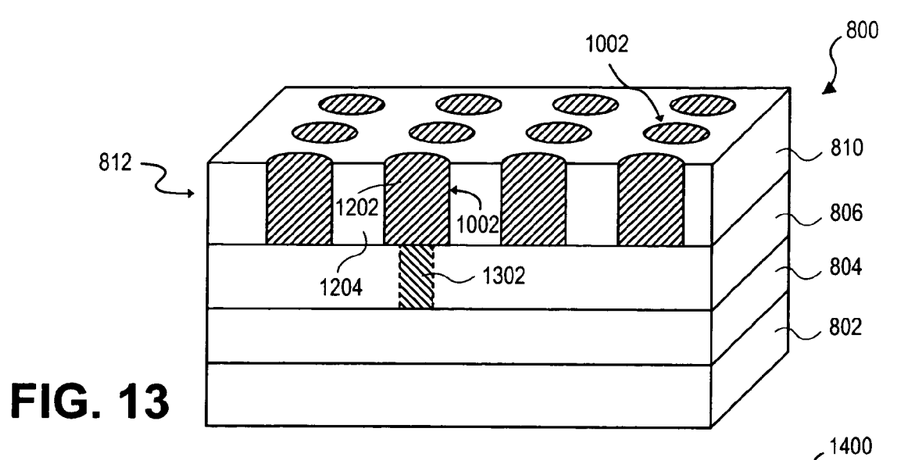
FIG. 13 is the device of FIG. 8 after the further processing operation of removing excess silicon nanocrystals.

As illustrated in FIG. 9, a porous polymer layer 902 is then formed on insulating layer 810. The porous polymer layer 902 may be a material having polymer molecules that self assemble into an organized pattern. In one aspect, the porous polymer material may be a diblock copolymer, which, when annealed, for example in an oven, forms nanometer-scale patterns called microdomains 904. These microdomains 904 organize into an array of cylinders over the underlying oxide hard mask layer 810 as shown. The polymer material forming microdomains 904 may be selectively etched away, for example with ozone. Once the material is removed, the remaining diblock copolymer pattern may be transferred to the underlying oxide hard mask layer 810 through reactive ion etching as shown in FIG. 10. In this aspect, regions 1002 of oxide hard mask layer 810 coextensive with microdomains 904 are removed creating an array of pores. As illustrated in FIG. 11, porous polymer layer 902 is then removed by any technique such as, for example, polishing. A conductive layer 1202 is then formed on the patterned insulating layer 810 by any suitable technique deemed desirable. As shown in FIG. 12, conductive layer 1202 fills in regions 1002 of oxide hard mask layer 810 resulting in an array of conductive regions 1202 and insulating regions 1204. Conductive layer 1202 may be of a material similar to the conductive materials described in reference to FIG. 6. Excess conductive material is removed by any suitable technique such as, for example, polishing as shown in FIG. 13. The resulting array of conductive regions 1202 represent the conductive paths and insulating regions 1204 the insulating matrix which form current focusing layer 812. Once current focusing layer 812 is formed, a region 1302 of modifiable layer 806 underlying each conductive path 1002 may be transformed from a first phase (e.g., an amorphous phase) to a second phase (e.g., a polycrystalline phase) with a relatively higher or lower resistivity. Region 1302 may then represent a data bit that can be read using a probe. Although not shown, the optional wear-resistant layer as previously discussed may be formed over current focusing layer 812.

Figure 14:
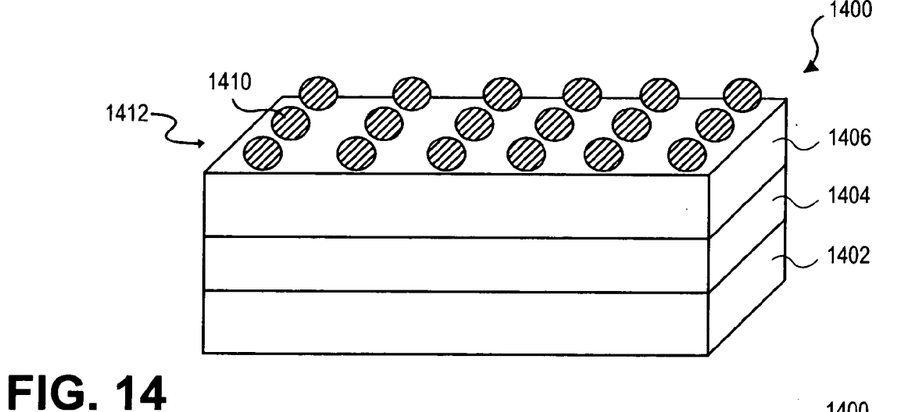
FIG. 14 is a perspective view of another embodiment of the device of FIGS. 4A and 4B wherein the current focusing layer is formed using a nanocrystal self-assembled monolayer.

FIG. 14 is another embodiment of the device of FIGS. 4A and 4B wherein the current focusing layer is formed using a nanocrystal self-assembled monolayer. In this embodiment, memory cell 1400 includes a substrate 1402 with an electrode 1404 formed thereon. Optionally, a dielectric layer (not shown) may be formed between substrate 1402 and electrode 1404. Modifiable layer 1406 is formed on electrode 1404. In this embodiment, current focusing layer 1412 is formed by depositing nanoparticles 1410 on modifiable layer 1406. Nanoparticles 1410 may be made of any suitable conductive material including metals or non-metals. Suitable conductive metals, may include, but are not limited to, metals or metal alloys of gold, silver, iron, nickel or copper. Alternatively, the conductive material may be a non-metal conductor such as a ceramic. In one embodiment, nanoparticles 1410 may be cobalt (Co) nanocrystals having any shape deemed suitable for forming conductive pathways within an insulating matrix as described herein. Nanoparticles 1410 may be deposited on modifiable layer 1406 by any suitable technique, including, but not limited to, a spin technique. In this aspect, nanoparticles 1410 form an array of conductive particles along the surface of modifiable layer 1406 with spaces in between.

Figure 15:
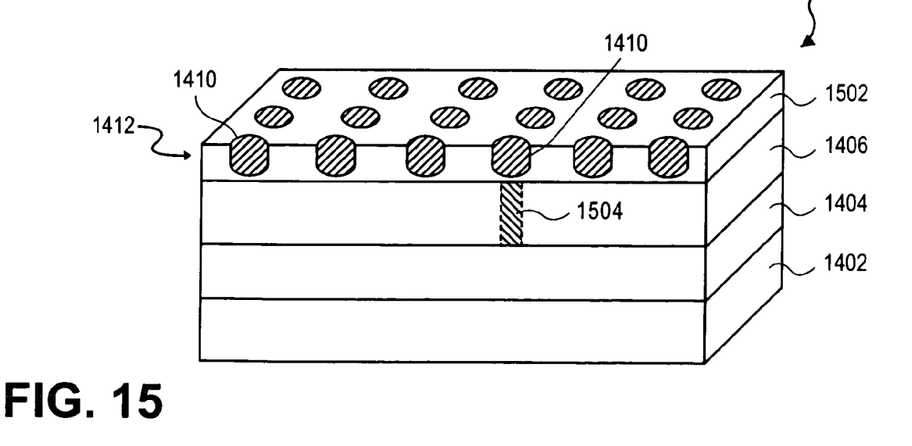
FIG. 15 is the device of FIG. 14 after the further processing operation of applying an insulating material.

As illustrated in FIG. 15, these spaces may be filled by forming an insulating layer 1502 around nanoparticles 1410 by any suitable technique deemed desirable. Insulating layer 1502 may be any suitable insulating material, including, but not limited to silicon oxide ($SiO_2$) or silicon nitride (SiN). The array of conductive nanoparticles 1410 embedded within insulating layer 1502 matrix represent the conductive paths and insulating matrix which form current focusing layer 1412. Once current focusing layer 1412 is formed, a region 1504 of modifiable layer 1406 underlying each conductive path 1410 may be transformed from a first phase (e.g., an amorphous phase) to a second phase (e.g., a polycrystalline phase) with a relatively higher or lower resistivity. Region 1504 may then represent a data bit that can be read using a probe. Although not shown, the optional wear-resistant layer as previously discussed may be formed over current focusing layer 1412.

Figure 16:
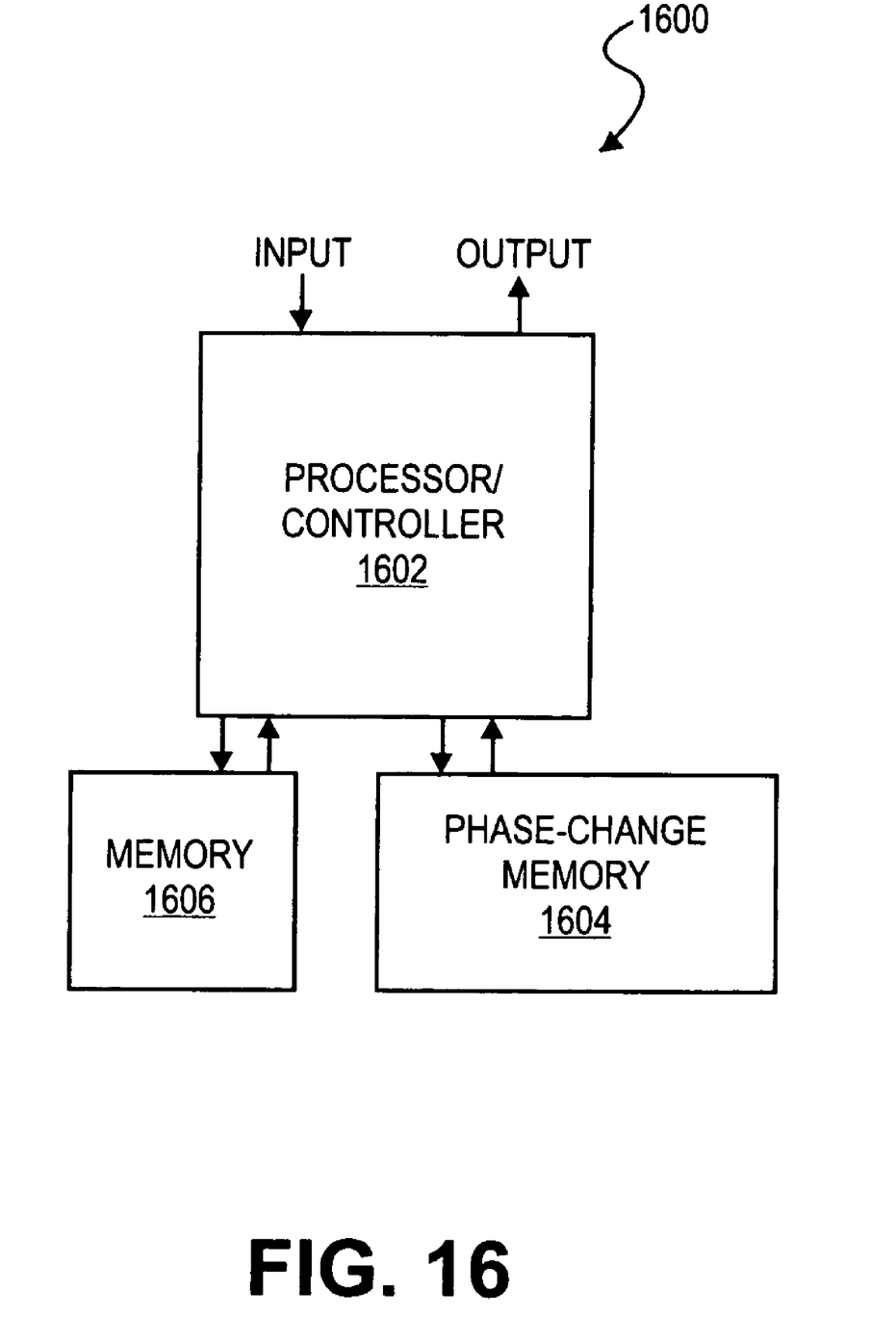
FIG. 16 is a schematic block diagram of an embodiment of a system using one or more embodiments of a memory such as those shown in FIGS. 5-15.

FIG. 16 is a schematic block diagram of an embodiment of a system using one or more embodiments of a modifiable memory such as those shown in FIGS. 5-15. FIG. 16 illustrates an embodiment of a system 1600 including an embodiment of a memory such as memory 300 that can include memory cells such as memory 400. System 1600 includes a processor 1602 to which are coupled a memory 1606 and a modifiable memory, for example, a phase-change memory 1604, such as a probe based memory, for example, seek-scan probe (SSP) memory. Alternatively, memory 1604 may be a resistance switching memory.

Processor 1602, in addition to being coupled to memories 1604 and 1606, has an input and an output through which it can receive data and send data, respectively. In one embodiment processor 1602 can be a traditional general-purpose microprocessor, although in other embodiments processor 1602 can be another type of processor, such as a programmable controller or an application-specific integrated circuit (ASIC).

Memory 1606 can be any type of volatile or non-volatile memory or storage. Volatile memories that can be used in different embodiments of memory 1606 include random-access memory (RAM), dynamic random access memory (DRAM), synchronous dynamic random access memory (SDRAM) and the like. Non-volatile memories that can be used in different embodiments of memory 1606 include magnetic and optical disk drives.

Phase-change memory 1604 can, in different embodiments, be a memory such as memories 200 or 300 shown in FIGS. 2 and 3 respectively. Different embodiments of memories 200 or 300 can include therein memory cells with the constructions shown in connection with memory 400. In still other embodiments, every memory cell within a memory such as memory 200 or 300 need not have the same construction; any given memory can include cells of different constructions.

In operation of system 1600, processor 1602 can receive and send data through its input and output, and can both read and write data to both the memory 1606 and phase-change memory 1604. Processor 1602 can control, for example, the writing, reading and/or erasure of data from one or more cells in phase-change memory 1604 by selectively activating the relevant cell. If information in a cell within the phase-change memory needs to be corrected, the data can be read from the phase-change memory 1604 and temporarily held in memory 1606. While the data is held in memory 1606, the relevant cells in phase-change memory 1604 are erased and the data can then be retrieved from memory 1606 and re-written onto the phase-change cells where it previously was written.

In the preceding detailed description, specific embodiments are illustrated, including an apparatus, system and method for a current focusing probe based phase-change memory. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention. The specification and drawings are, accordingly, to be regarded in an illustrative rather than a restrictive sense.

What is claimed is:

1. An apparatus comprising:
    a substrate;
    an electrode coupled to the substrate;
    a modifiable layer coupled to the electrode, the modifiable layer including a plurality of bits; and
    a current focusing layer coupled to the modifiable layer, the current focusing layer comprising a plurality of vertically disposed conductive regions and a plurality of vertically disposed insulating regions, wherein the conductive regions form a planar interface with the modifiable layer, wherein each bit is aligned with only one vertically disposed conductive region, and wherein each vertically disposed conductive region is aligned with only one bit.

2. The apparatus of claim 1 further comprising:
    a wear-resistant layer formed on the current focusing layer to protect the current focusing layer from contaminates and to minimize mechanical damage to the apparatus from contact by a probe tip.

3. The apparatus of claim 2, wherein the wear-resistant layer: (1) has a first surface attached to the current focusing layer and an opposing surface that is exposed for contact from the tip of a probe; (2) has one of a hardness matching that of the tip of the probe; (3) has a low friction of coefficient with respect to the tip surface, and (4) has a high asymmetric electrical conductivity or has a low energy barrier electronic tunneling property.

4. The apparatus of claim 2, wherein the wear resistant layer is a ceramic material.

5. The apparatus of claim 1 wherein the modifiable layer comprises a phase-change material that changes phase in response to an electric current.

6. The apparatus of claim 1 wherein the current focusing layer comprises an array of conductive paths within an insulating matrix.

7. The apparatus of claim 6 wherein the conductive paths are in a direction parallel to a direction of an electric field applied to the current focusing layer.

8. The apparatus of claim 1 wherein the current focusing layer comprises conductive nanoparticles of nanocrystals within an insulating layer.

9. The apparatus of claim 1 wherein the modifiable layer comprises a resistance switching layer that changes resistance in response to an electric current.

10. The apparatus of claim 1, wherein the modifiable layer comprises a planar top surface and a planar bottom surface; the electrode comprises a planar top surface; the conductive regions comprise a planar top surface and a planar bottom surface; and the insulating regions comprise a planar top surface and a planar bottom surface.

11. The apparatus of claim 1, wherein the current focusing layer is a thin film formed using lithography free synthesis techniques, the film including pillars, or nanoparticles, a conductive material formed within an insulating matrix.

12. The apparatus of claim 11, wherein the current focusing layer comprises conductive paths having a diameter of between about 10 nm and 30 nm formed in one of an anodized aluminum oxide insulative film, and a co-polymer templated insulator.

13. The apparatus of claim 1, wherein the current focusing layer comprises one of: (1) an anodized aluminum oxide nanopore engineered film of insulator having a self organized uniform array of highly anisotropic pores filled with conductive material, (2) a copolymer templated assembly of insulating self organized nanometer-scale pores filled with conductive material, (3) a nanocrystal self assembled monolayer array of conductive nanoparticles embedded within an insulating layer matrix, or (4) an anti-fuse material of non conducting amorphous silicon or carbon having polycrystalline silicon metal alloy conductive regions formed by a voltage applied across the silicon or carbon using a probe tip.

14. The apparatus of claim 1, wherein each conductive region is a single region of conductive material.

15. The apparatus of claim 1, wherein the conductive regions are an elemental metal of one of gold, silver, iron, nickel and copper.

16. The apparatus of claim 1, wherein each conductive region is a single pillar.

17. The apparatus of claim 16, wherein the modifiable layer comprises a continuous layer of a phase-change material that has the bits at locations where the material changes phase in response to an electric current received through a vertically disposed conductive region.

18. A system comprising:
a processor;
a DRAM memory coupled to the processor; and
a memory coupled to the processor, the memory comprising:
 a substrate;
 an electrode coupled to the substrate;
 a modifiable layer coupled to the electrode, the modifiable layer including a plurality of bits; and
 a current focusing layer coupled to the modifiable layer, the current focusing layer comprising a plurality of vertically disposed conductive regions and a plurality of vertically disposed insulating regions, wherein the conductive regions form a planar interface with the modifiable layer, wherein each bit is aligned with only one vertically disposed conductive region, and wherein each vertically disposed conductive region is aligned with only one bit.

19. The system of claim 18 further comprising:
a wear-resistant layer formed on the current focusing layer to protect the current focusing layer from contaminates and to minimize mechanical damage to the apparatus from contact by a probe tip.

20. The system of claim 19, wherein the wear resistant layer is a ceramic material.

21. The system of claim 18 wherein the modifiable layer comprises a phase-change material.

22. The system of claim 18 wherein the current focusing layer comprises an array of conductive paths within an insulating matrix.

23. The system of claim 22 wherein the conductive paths are in a direction parallel to a direction of an electric field applied to the current focusing layer.

24. The system of claim 18 wherein the current focusing layer comprises conductive nanoparticles of nanocrystals within an insulating layer.

25. The system of claim 18, wherein the modifiable layer comprises a planar top surface and a planar bottom surface; the electrode comprises a planar top surface; the conductive regions comprise a planar top surface and a planar bottom surface; and the insulating regions comprise a planar top surface and a planar bottom surface.

26. The system of claim 18, wherein the wear-resistant layer: (1) has a first surface attached to the current focusing layer and an opposing surface that is exposed for contact from the tip of a probe; (2) has one of a hardness matching that of the tip of the probe; (3) has a low friction of coefficient with respect to the tip surface, and (4) has a high asymmetric electrical conductivity or has a low energy barrier electronic tunneling property.

27. The system of claim 18, wherein the current focusing layer is a thin film formed using lithography free synthesis techniques, the film including pillars, or nanoparticles, a conductive material formed within an insulating matrix.

28. The system of claim 18, wherein the current focusing layer comprises conductive paths having a diameter of between about 10 nm and 30 nm formed in one of an anodized aluminum oxide insulative film, and a co-polymer templated insulator.

29. The system of claim 18, wherein the current focusing layer comprises one of: (1) an anodized aluminum oxide nanopore engineered film of insulator having a self organized uniform array of highly anisotropic pores filled with conductive material, (2) a copolymer templated assembly of insulating self organized nanometer-scale pores filled with conductive material, (3) a nanocrystal self assembled monolayer array of conductive nanoparticles embedded within an insulating layer matrix, or (4) an anti-fuse material of non conducting amorphous silicon or carbon having polycrystalline silicon metal alloy conductive regions formed by a voltage applied across the silicon or carbon using a probe tip.

30. The system of claim 18, wherein each conductive region is a single region of conductive material.

31. The system of claim 18, wherein the conductive regions are an elemental metal of one of gold, silver, iron, nickel and copper.

32. The system of claim 18, wherein each conductive region is a single pillar.

33. The system of claim 32, wherein the modifiable layer comprises a continuous layer of a phase-change material that has the bits at locations where the material changes phase in response to an electric current received through a vertically disposed conductive region.

* * * * *